United States Patent
Brueske et al.

(10) Patent No.: US 6,288,609 B1
(45) Date of Patent: Sep. 11, 2001

(54) GAIN CONTROLLABLE LOW NOISE AMPLIFIER WITH AUTOMATIC LINEARITY ENHANCEMENT AND METHOD OF DOING SAME

(75) Inventors: Daniel E. Brueske, Plantation, FL (US); David J. Graham, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,742

(22) Filed: Feb. 29, 2000

(51) Int. Cl.$^7$ ........................................ H03G 3/20
(52) U.S. Cl. ................. 330/129; 330/85; 330/285; 455/234.1
(58) Field of Search .................. 330/85, 129, 285; 455/234.1

(56) References Cited

U.S. PATENT DOCUMENTS 2,860,241 * 11/1958 Post ................................. 250/27
6,081,558 * 6/2000 North ............................. 375/316
6,137,357 * 10/2000 Dekker ............................ 330/129

* cited by examiner

Primary Examiner—Robert Pascal
Assistant Examiner—Henry Choe
(74) Attorney, Agent, or Firm—Frank M. Scutch

(57) ABSTRACT

A gain controllable low noise amplifier (LNA) (200) with automatic linearity enhancement utilizes an amplifier stage (203) for amplifying a radio frequency (RF) input signal and a dynamically controllable feedback loop amplifier stage (205) for providing negative feedback to the feedback amplifier. A bias controller (213) is coupled to the dynamically controllable feedback loop amplifier stage (203) for monitoring a receiver automatic gain control (AGC) system (211) and providing a dynamic bias to the feedback loop amplifier stage (205) to improve linearity to the LNA in the presence of strong on-channel and off-channel signal conditions.

11 Claims, 3 Drawing Sheets

GAIN CONTROLLABLE LOW NOISE AMPLIFIER WITH AUTOMATIC LINEARITY ENHANCEMENT AND METHOD OF DOING SAME

TECHNICAL FIELD

This invention relates in general to low noise amplifiers and more specifically to amplifiers used in radio frequency (RF) receivers.

BACKGROUND

Modem communication receivers are often required to operate over a large dynamic range. A typical prior art receiver architecture is shown in prior art FIG. 1. Many times in order to comply with the system dynamic range requirements, a receiver will incorporate gain controllable amplifiers to adapt the receiver gain to a wide variety of signal conditions. Those skilled in the art will recognize that it is desirable to increase system linearity in the presence of strong on or off channel signals in order to avoid creating intermodulation (IM) products in the desired signal passband. Typically, system linearity can be improved by reducing gain before reaching the IM limiting stages. For some systems, it is desirable to use amplifiers with continuously variable gain to optimize the required gain reduction. At best, many of these continuously variable gain amplifiers have constant third order intercept (IM³) over their gain control range, and at the worst, the third order intercept degrades with increasing attenuation.

The gain controllable amplifiers are usually placed near the front of a radio frequency (RF) or intermediate frequency (IF) string in the receiver thus allowing for system intermodulation improvements when gain is decreased. For large signals that require large amounts of gain reduction, the adjustable gain amplifier often becomes the limiting factor for the receiver's IM performance. In these circumstances, the designer of the stage would need to design an amplifier having sufficient IM performance required for strong signal conditions. Those skilled in high frequency circuit design will recognize the need for larger current drain for higher IM performance. This results in excess current drain for weak signal conditions when high linearity is not as important.

Thus, the need exists to provide a low noise amplifier (LNA) system topology such that a decreased amount of dynamic range is required by the LNA thereby requiring a lesser amount of current drain. This had the overall effect of providing a more efficient amplifier capable of handling a wide range of signal levels with relatively small current drain when integrated into a receiver IC package.

DETAILED DESCRIPTION OF THE PREFERRED EMBODIMENT

The invention herein incorporates a feedback mechanism around a gain controllable amplifier stage that results in enhanced linearity performance for strong signal conditions where gain reduction is required without sacrificing the interface or degrading performance. The invention allows the amplifier bias current to be set lower for signal conditions in which no or little gain reduction is needed (weak signals). This allows for enhanced linearity performance, with its associated current drain penalty, only when the enhanced performance is needed, thus allowing for potential current drain savings without sacrificing linearity performance. Moreover, the invention proposed provides a fully integrated solution without the need for integrated inductors and uses a unique topology with MOSFETS for improved performance. The invention functions as the Low Noise Amplifier/Variable Gain Amplifier (LNA/VGA) usually implemented as a stage in Intermediate Frequency (IF) or Direct Conversion Receiver (DCR) RF processing blocks.

Figure 2:
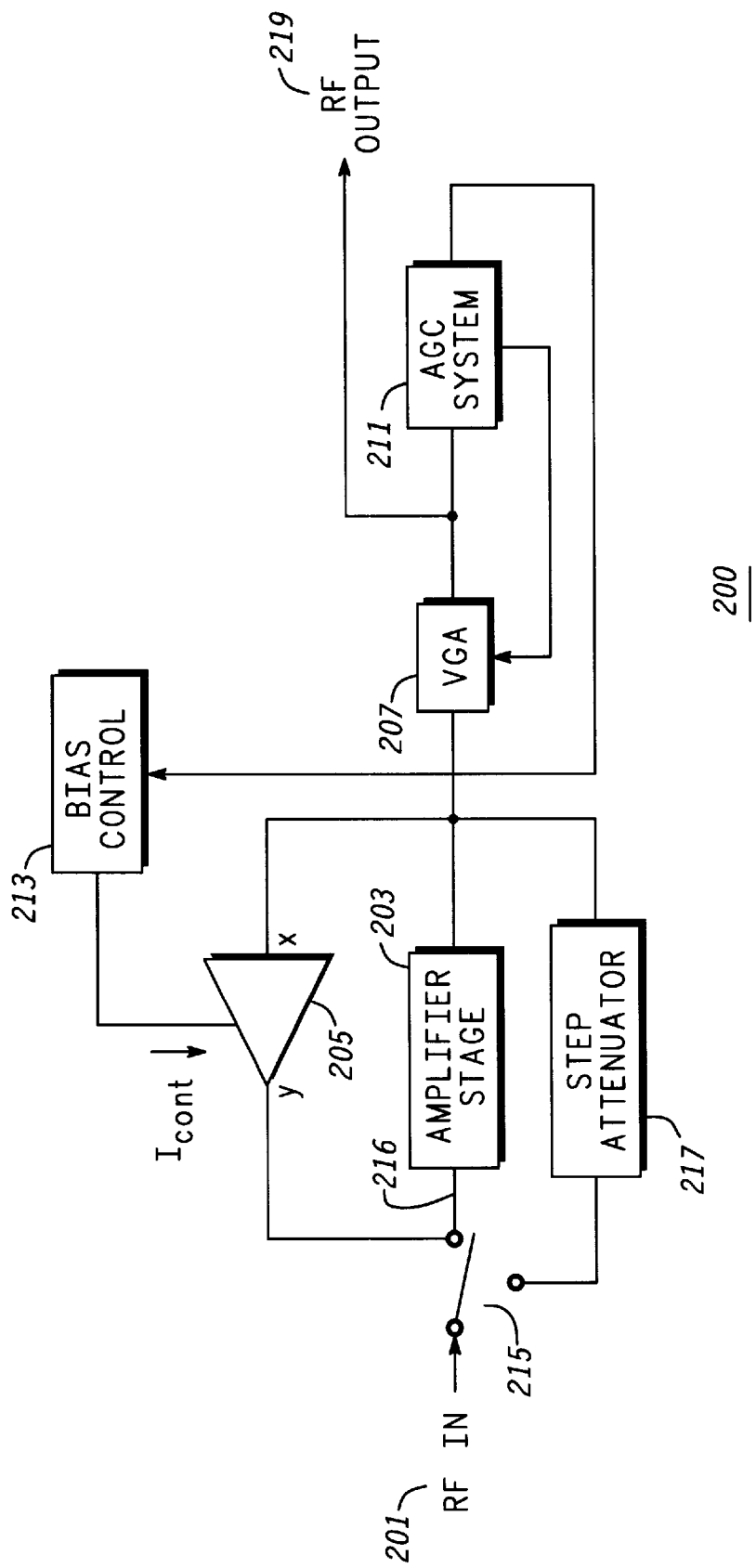
FIG. 2 is a block diagram showing a gain controllable low noise amplifier with linearity enhancement in accordance with the present invention.

Referring now to FIG. 2, a gain controllable low noise amplifier (LNA) system with automatic linearity enhancement 200 operates using a radio frequency (RF) input that feeds an amplifier stage 203 incorporating a feedback stage or loop 205. Increased linearity from the amplifier system 200 can be achieved by increasing a control current, $I_{cont}$ to the feedback stage 205.

As is well known in the art, the gain of the feedback loop 205 can be represented by the equation: $y = xa_1 + x^2a_2 + x^3a_3 + \ldots$ where x represents the input signal, y represents the output signal and the coefficients $a_2$, $a_3$ represent non-linear components that optimally should equal zero if the stage where to have an infinite dynamic range. If this were the case $y=xa_1$ and the stage would be entirely linear. In order to control linearity of the LNA 200, the non-linear coefficients $a_2$ and $a_3$ can then be changed by dynamically adjusting the bias of the feedback loop 205. Those skilled in the art will recognize that a RF amplifier's system linearity can only be as good as its feedback linearity. Since non-linearity is dominated by the feedback loop 205, linearity can be altered by changing the current supplied to the feedback loop 205 and thus the linearity of LNA 200 can be dynamically adjusted through feedback loop 205.

Dynamic bias adjustment of the feedback loop 205 is accomplished using a variable gain amplifier (VGA) 207 that receives the output of the amplifier stage 203 where it is amplified and passed to an AGC system 211. The AGC system 211 acts to provide an AGC signal that is proportional to the input signal strength in decibels (dB). The AGC signal provided by the AGC system 211 is used by a bias controller to provide a dynamically controlled input bias to the feedback loop 205. Thus, bias control to the feedback loop 205 is done by monitoring the AGC system 211 while using a unique bias control to adjust control current to the feedback loop 205. The RF output 219 of LNA 200 is provided at the output of the VGA 207.

Those skilled in the art will recognize that any circuit for adjusting the bias current in the LNA 200 is based on the amount of AGC attenuation in the system causes the control current to increase as AGC attenuation increases. This result acts to improve LNA 200 linearity for higher amplitude input signals. This implementation also incorporates a limiting function that sets an upper limit on the amount of increase in the control current and provides added flexibility in implementing a gain stage requiring high linearity when high signal conditions are detected. This topology provides a continuous adjustment to the feedback loop 205 bias current thus achieving improved linearity on demand without suffering discontinuities in the signal that can result for step switched bias and/or attenuator networks known in the prior art.

Additionally, the LNA 200 uses a switch 215 and step attenuator 217 to control the amplitude of the RF signal into the VGA 207. When actuated, the input signal bypasses the amplifier stage 203 and is passed directly to the VGA 207 through step attenuator 217. The step attenuator 217 is used to increase the input compression point of the amplifier stage 203 allowing strong signals to pass through the system. Generally, IC step attenuators involve a programmable connection of a resistive pad before the LNA, thus reducing the input signal level at the LNA. This method provides no reduction in current since the same LNA is used. The step attenuator 217 of the present invention electronically reconfigures the LNA 200 by programming the IC. In practice there may be two modes of operation namely, a normal mode and a step attenuator mode. In the step attenuator mode the circuits are reconfigured in such a way that allows a substantial reduction in current compared to the normal mode of operation for the given RF conditions and desired performance. For the strong signal condition, noise figure of the circuit is not critical. The LNA circuit 200 are reconfigured into a topology which takes advantage of this fact. However, the trade-off between circuit topology is an increase in noise figure with a reduction in current drain. Therefore, a substantial decrease in current drain can be achieved without loss of performance for the given condition by programmability of the LNA 200.

Figure 3:
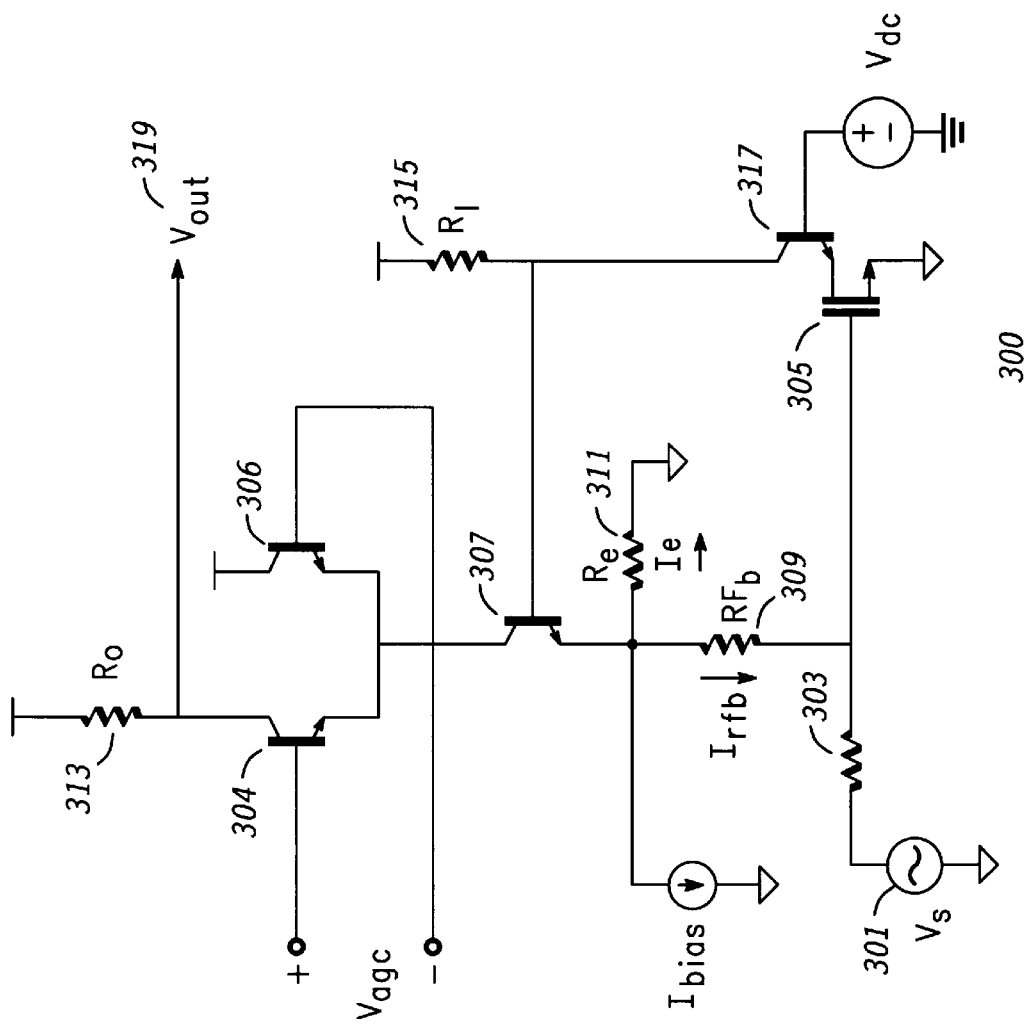
FIG. 3 is a circuit diagram showing one embodiment of a gain controllable low noise amplifier with linearity enhancement in accordance with the present invention.

FIG. 3 illustrates a circuit diagram showing the LNA 300 in accordance with one embodiment of the invention. In operation, a source signal $V_s$ 301 is applied to the LNA 300 through the source resistance 303. The input voltage signal is then amplified by a Metal Oxide Semiconductor Field Effect Transistor (MOSFET) 305 and load resistor $R_l$ 315. Transistor 307 provides feedback through resistor 309 to the input while simultaneously acting as a buffer from the Variable Gain Amplifier (VGA) comprised of transistor 304 and transistor 306 connected in a common base configuration. Transistor 307 converts the signal into a current while the current mode signal then passes through the VGA to output resistor $R_o$ 313. Current $I_{bias}$ provides the DC current to the VGA and thus sets the direct current (DC) voltage offset at the output $V_{out}$ 319. The current through MOSFET 305 is controlled by the supply voltage or load resistor $R_l$ 315. The values for $I_{bias}$, feedback resistor $R_{fb}$ 309, emitter resistor $R_e$ 311, load resistor $R_l$ 315, and MOSFET 305 can be chosen and optimized for a given noise figure (NF), amplifier gain ($G_p$), third order distortion products ($p^3$), and input impedance ($Z_{in}$) combination.

As will be evident to those skilled in the art, transistor 307 is in the feedback loop and acts as an emitter follower. Both DC and AC voltage variations at the input to the VGA are isolated from the feedback loop $I_{fb}$. This works to isolate the output RF signals from the RF input signals and more importantly provides a path in which to independently control the bias currents through output resistor $R_o$ 313. This independent control is the key to integrating resistor 313. In previous LNAs known in the prior art, bias was determined by the bias provided through the active input device. This bias is generally large to help the active device achieve the necessary dynamic range. This invention provides a system and method in which to control the current independent of the bias through the input active device. Because output resistance $R_o$ 313 is generally large to help reduce the noise figure of a subsequent stage and increase the gain of the LNA 300, the DC voltage drop across output resistor $R_o$ 313 can get substantially large unless the current can be reduced through independent control. The present invention provides a solution to his problem. Moreover, the active feedback provides an extra degree of freedom in which to optimize the interplay between NF, $G_p$, $IP^3$, and $Z_{in}$. In general, by increasing the feedback resistance 309 the input impedance ($Z_{in}$) and gain ($G_p$) will rise while the intermodulation degrade and noise figure (NF) will improve. Obviously, the converse is true for the feedback resistance 309 is decreased.

By using MOSFET 305, as the active gain device instead of a bipolar junction transistor (BJT) with resistive degeneration, less current is needed to obtain the same dynamic range. For a large signal operation, MOSFET 305 produces third order intermodulation ($IP^3$) terms which are smaller than that of a BJT implementation with the same current. Accordingly, large parasitics will exist for a metal oxide semiconductor field effect transistor (MOSFET) implementation since the geometric dimensions are significantly larger than a BJT implementation. A cascoded stage such as transistor 317 is used with the MOSFET to reduce the Miller effect due to the parasitics. This cascoded stage using transistor 317 reduces the voltage gain from the gate to drain of MOSFET 305 and provides a low impedance point for the drain parasitics to the analog ground thereby increasing the bandwidth of operation. Should be noted that very little impact on noise figure and dynamic range results from the cascoded implementation shown in FIG. 3. The parasitics from the gate to source of MOSFET 305 can easily be included as part of the external match, thus should have limited impact on high frequency operation.

Figure 1:
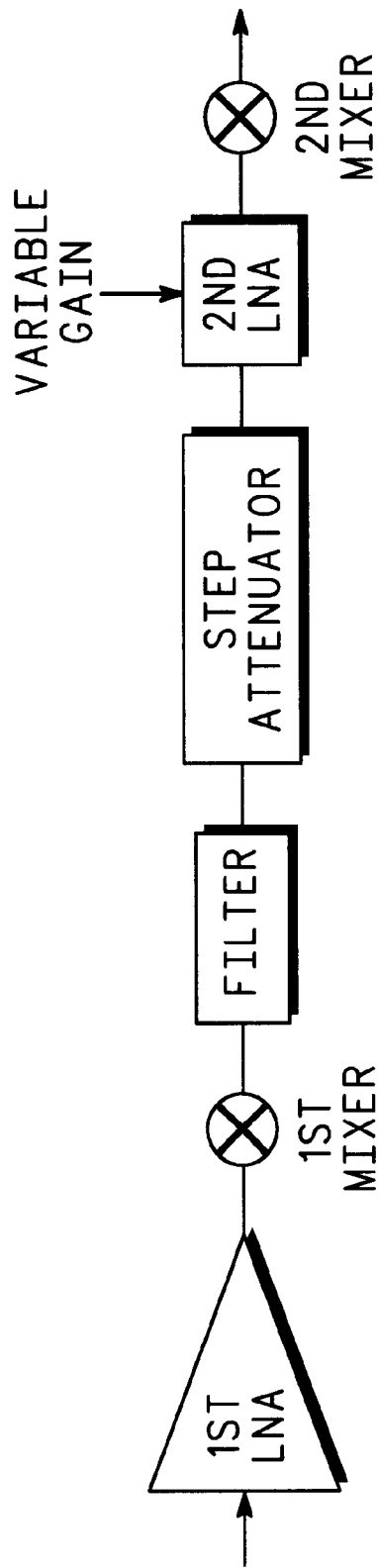
FIG. 1 is a block diagram showing a portion of an radio frequency receiver.

A key element to the present invention is maintaining a constant input impedance and gain ratio between the two modes of operation (normal and step attenuator modes). Because the LNA circuit 200/300 are integrated and on the same IC substrate, matching can be used to help maintain a constant input impedance and power gain ratio. It is important to keep the same input impedance so as not to effect the RF match to any filter (as seen in FIG. 1). Variations in the match will change the filter response which is undesirable. Also, the power gain ratio is important to keep constant from part to part so that there is no variation in the amount of step attenuation. This compensation is independent of the LNA step attenuation 217 and is constant from part to part, thus the gain ratio between normal and step operation must be constant.

In summary, previous IC LNA structures typically use an inductor external to the IC to provide bias and matching at the output. The invention as defined herein requires neither an external nor integrated inductor. A resistor is used instead of an inductor at the output. A problem arises when trying to use a large resistor with large bias currents. The DC voltage drop at the output becomes too large and the circuitry becomes unoperational. With a common base or emitter type of LNA the RF performance attainable is limited because currents become too large and the output resistor too small. Using the proposed topology as shown in FIG. 3, this drawback can readily be resolved. Additionally, the LNA structure of the invention allows for an additional degree of freedom compared to a common base or emitter structures of the prior art. The feedback resistor $R_{fb}$ 309 and $I_{bias}$ can be independently adjusted for a desired NF, $G_p$, $IP^3$ and $Z_{in}$ specification. Lastly, the LNA uses a MOSFET device to enhance the dynamic range for a desired given current drain. Those skilled in the art will recognize that this variation in current will not effect the input impedance of the LNA since the feedback impedance dominates this value. The noise figure of the feedback stage will be minimally impacted as well.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A gain controllable low noise amplifier (LNA) with automatic linearity enhancement comprising:

an amplifier stage for amplifying a radio frequency (RF) input signal;

a dynamically controllable feedback loop amplifier stage for providing negative feedback to the feedback amplifier;

a bias controller coupled to the dynamically controllable feedback loop amplifier stage for monitoring a receiver automatic gain control (AGC) system and providing a dynamic bias to the dynamically controllable feedback loop amplifier stage to improve linearity to the LNA in the presence of strong on-channel and off-channel signal conditions; and at least one variable gain amplifier (VGA) for amplifying an output of the first feedback amplifier stage and supplying an RF output signal; and an AGC control system to control the gain of the LNA and for providing a scaled biased voltage for bias control.

2. A gain controllable LNA as in claim 1, wherein the at least one VGA provides a feedback signal to the bias controller for optimizing current drain of the LNA.

3. A gain controllable LNA as in claim 1, further comprising:

at least one step attenuator for attenuating the RF input signal provided to the feedback loop amplifier stage.

4. A gain controllable LNA as in claim 1, wherein;

the dynamically controllable feedback loop amplifier stage comprises at least one MOSFET device.

5. A gain controllable radio frequency (RF) amplifier with automatic linearity enhancement comprising:

an first amplifier stage for amplifying an RF input signal;

a feedback loop for providing feedback to the input of the amplifier stage for increasing linearity of the amplifier;

a second amplifier stage for amplifying the output of the first amplifier stage and providing an RF output;

a receiver automatic gain control (AGC) system for providing a control bias based on an output signal from the second amplifier stage;

a bias controller connected to the feedback loop for dynamically changing bias to the feedback loop based on the control bias from the AGC system; and wherein the linearity and current consumption of the LNA is dynamically controlled by the bias controller in the presence of strong on-channel and off-channel signal conditions.

6. A gain controllable RF amplifier as in claim 5, wherein the first amplifier stage utilizes a MOSFET device.

7. A gain controllable RF amplifier as in claim 5, wherein the second amplifier stage is a variable gain amplifier (VGA).

8. A gain controllable RF amplifier as in claim 5, further comprising:

a step attenuator for attenuating the RF input signal to the second amplifier stage.

9. A gain controllable RF amplifier as in claim 8, wherein the step attenuator is connected in parallel with the amplifier stage.

10. A method for controlling the gain and enhancing linearity of a low noise radio frequency (RF) amplifier comprising the steps of:

providing an RF input signal to a first amplifier stage;

feeding back a portion of the first amplifier stage using a feedback loop amplifier to the input of the first amplifier stage;

inputting the output of the first amplifier stage to a second amplifier stage;

providing the second amplifier stage to a receiver automatic gain control (AGC) system and providing an AGC signal therefrom; and supplying the AGC signal to a bias controller for dynamically controlling the bias to a feedback loop amplifier to improve linearity and control current consumption of the first amplifier stage in the presence of strong on-channel and off-channel signal conditions.

11. A method for controlling the gain and enhancing linearity of a low noise RF amplifier as in claim 10, wherein: the first amplifier stage includes at least one MOSFET device.

* * * * *